United States Patent [19]

Ando et al.

[11] Patent Number: 5,045,744
[45] Date of Patent: * Sep. 3, 1991

[54] ENERGY-TRAPPING-BY-FREQUENCY-LOWERING-TYPE PIEZOELECTRIC-RESONANCE DEVICE

[75] Inventors: Akira Ando; Toshihiko Kittaka; Hiroshi Tamura; Isao Toyoshima, all of Nagaokakyo, Japan

[73] Assignee: Murata Mfg. Co., Japan

[*] Notice: The portion of the term of this patent subsequent to Feb. 13, 2007 has been disclaimed.

[21] Appl. No.: 454,362

[22] Filed: Dec. 21, 1989

[30] Foreign Application Priority Data

Dec. 23, 1988 [JP] Japan ................................. 63-327253
Dec. 23, 1988 [JP] Japan ................................. 63-327254
Dec. 23, 1988 [JP] Japan ................................. 63-327255

[51] Int. Cl.$^5$ ............................................. H01L 41/08
[52] U.S. Cl. .................................... 310/320; 310/365; 310/366; 310/359
[58] Field of Search ............... 310/320, 358, 359, 365, 310/366

[56] References Cited

U.S. PATENT DOCUMENTS

| | | | |
|---|---|---|---|
| 3,401,377 | 9/1968 | Bartlett et al. | 310/328 |
| 3,733,590 | 5/1973 | Kaufman | 310/366 |
| 4,218,631 | 8/1980 | Yamaguchi | 310/365 |
| 4,876,476 | 10/1989 | Kittaka et al. | 310/320 |
| 4,918,350 | 4/1990 | Ando et al. | 310/320 |
| 4,939,403 | 7/1990 | Kittaka et al. | 310/320 |

Primary Examiner—Mark O. Budd
Assistant Examiner—Thomas M. Dougherty
Attorney, Agent, or Firm—Ostrolenk, Faber, Gerb & Soffen

[57] ABSTRACT

Disclosed is an energy-trapping-by-frequency-lowering-type piezoelectric-resonance device utilizing a higher harmonic in the mode of thickness-extensional vibration, in which at least three electrodes for energy trapping are arranged so as to be overlapped with each other in the direction of thickness of layers of piezoelectric material forming a plate-shaped body. The three electrodes comprise a pair of outermost electrodes and at least one inner electrode. The diameter of one polygonal side of at least one outermost electrode is made larger than the diameter of one polygonal side of an inner electrode.

8 Claims, 11 Drawing Sheets

ENERGY-TRAPPING-BY-FREQUENCY-LOWERING-TYPE PIEZOELECTRIC-RESONANCE DEVICE

CROSS-REFERENCE TO RELATED APPLICATIONS

This application is related to Ser. No. 07/215,549 filed July 6, 1988; allowed and Ser. No. 07/291,793 filed Dec. 29, 1988; Ser. No. 07/211,777 filed June 27, 1988, allowed, all commonly assigned herewith.

BACKGROUND OF THE INVENTION

1. Field of the Invention

The present invention relates generally to piezoelectric-resonance devices of an energy-trapped type utilizing a higher harmonic in the mode of thickness-extensional vibration, and more particularly, to piezoelectric-resonance devices having an improved electrode structure for energy trapping.

2. Description of Related Art

The described U.S. patent application Ser. No. 211,777 discloses a piezoelectric-resonance device which can be used in a high frequency region by utilizing a higher harmonic in the thickness-extensional vibration mode. In this piezoelectric-resonance device, a plurality of electrodes for energy trapping are arranged so as to be overlapped with each other through piezoelectric ceramic layers in a sintered body made of cofired type piezoelectric ceramics. Consequently, the piezoelectric-resonance device is constructed such that the higher harmonic in the thickness-extensional vibration mode is trapped in a region where the electrodes are overlapped with each other.

In the above described piezoelectric-resonance device, the higher harmonic in the thickness-extensional vibration mode is trapped. Accordingly, a first response in the thickness-extensional vibration mode appears in a higher frequency region, as compared with a conventional piezoelectric-resonance device in which electrodes for energy trapping are formed on both major surfaces of a single plate made of piezoelectric ceramics. Consequently, a piezoelectric-resonance device which can be used in a high frequency region can be achieved. In addition, the higher harmonic in the thickness-extensional vibration mode can be trapped using a piezoelectric material of composition having an effective Poisson's ratio of less than $\frac{1}{3}$ which could not be previously been used in a resonance device of an energy-trapped type. Accordingly, various piezoelectric materials can be suitably selected.

In the piezoelectric-resonance device disclosed in the above described related art, however, the plurality of electrodes for energy trapping arranged in the sintered body must be formed so as to be precisely overlapped with each other through piezoelectric ceramic layers; otherwise piezoelectric characteristics would greatly vary. However, it is difficult to prevent a shift in position between the plurality of electrodes. Accordingly, there results the need for complicated work of determining characteristics of piezoelectric-resonance devices produced in large quantity and selecting acceptable ones depending on their characteristics.

On the other hand, it is considered that a structure shown in FIG. 1 is employed so as to solve the above described variation in characteristics. In FIG. 1, ceramic green sheets 1 and 2 are laminated. Conductive pastes 3 and 4 for forming an electrode for energy trapping and a connecting conductive portion are applied to the upper surface of the ceramic green sheet 1. In this specification, the same reference numerals as those of an electrode for energy trapping and a connecting conductive portion which are finally completed by sintering are assigned to portions coated with conductive pastes for forming an electrode for energy trapping and a connecting conductive portion.

A conductive paste 5a is applied on the entire upper surface of the ceramic green sheet 2. On the other hand, conductive pastes 6 and 7 are applied to portions to be an electrode and a connecting conductive portion 2.

The above described ceramic green sheets 1 and 2 are laminated and, and then are subjected to polarization processing, thereby allowing a piezoelectric-resonance device 8 shown in FIG. 2 to be obtained. In this piezoelectric-resonance device 8, an electrode 5a in the position of its middle height is formed on the whole surface of the ceramic green sheet 2. Consequently, there occurs no shift in overlapping between the electrode 5a and the electrodes 3 and 6 on its upper and lower sides.

However, stray capacitance is produced between the whole surface electrode 5a and the connecting conductive portions 4 and 7 on its upper and lower sides. This stray capacitance causes a spurious mode to be excited in the band of frequencies between a resonance frequency and an antiresonance frequency. In addition, this stray capacitance causes the antiresonance frequency and antiresonance resistance to be decreased and causes the band of frequencies between the resonance and antiresonance frequencies to be narrowed. If the piezoelectric-resonance device 8 is applied to an oscillator or the like, the stray capacitance causes failures, such as interruption of oscillation.

SUMMARY OF THE INVENTION

Accordingly, an object of the present invention is to provide a piezoelectric-resonance device capable of effectively restraining spurious vibration superimposed on a higher harmonic in the thickness-extensional variation mode and having a structure in which the variation in characteristics due to the shift in position between electrodes for energy trapping is effectively reduced.

The present invention provides an energy-trapping-by-frequency-lowering-type piezoelectric-resonance device utilizing a higher harmonic in the thickness-extensional vibration mode, which comprises a plate-shaped body made of a piezoelectric-material subjected to polarization processing, and at least three electrodes for energy trapping arranged so as to be overlapped with each other through layers of the piezoelectric-material subjected to polarization processing in the direction of thickness of such plate-shaped body. In such piezoelectric-resonance device, the relation is improved between the shapes of the electrodes for energy trapping located on the outermost sides in the direction of thickness and the remaining electrode for energy trapping.

More specifically, the piezoelectric-resonance device is characterized in that the diameter or one side of at least one of the electrodes for energy trapping located on the outermost sides in the direction of thickness is made longer than the diameter or one side of the remaining electrode for energy trapping if the electrode for energy trapping on the outermost side is circular or polygonal in shape. Accordingly, precision is easily maintained for overlapping of the electrode for energy trapping on the inner side with the electrode for energy trapping on the outermost side whose diameter or one side is made relatively longer. More specifically, the allowable amount of the position where the electrode for energy trapping on the inner side is formed relative to the electrode for energy trapping on the outermost side is increased by making the electrode for energy trapping on the outermost side relatively large. Accordingly, the variation in piezoelectric characteristics due to the shift in position between the electrodes for energy trapping overlapped with each other can be reduced. In addition, as obvious from the embodiment as described later, occurrence of a spurious level in the band of frequencies between antiresonance and resonance frequencies can be effectively restrained.

In accordance with a particular aspect of the present invention, at least one electrode located on the inner side of the plate-shaped body is constituted by a plurality of electrode portions which are not electrically connected to each other.

Furthermore, in accordance with still another aspect of the present invention, the piezoelectric-resonance device is fabricated by the following method. More specifically, the fabricating method comprises the steps of printing a plurality of electrode pastes in a strip shape on first ceramic green sheets made of a piezoelectric-material, laminating at least one of the above mentioned first ceramic green sheets and at least one second ceramic green sheet without electrode paste applied thereon such that the above mentioned strip-shaped electrode paste portions are located on the inner side; applying pressure to obtain a laminated body; sintering the above mentioned laminated body to obtain a sintered body; providing electrodes for energy trapping on the upper and lower surfaces of the sintered body; applying a voltage between a plurality of strip-shaped inner electrodes formed of the strip-shaped electrode paste portions and the electrodes formed on the upper and lower surfaces of the sintered body to subject the sintered body to polarization Processing; and processing the electrodes formed on the upper and lower surfaces of the sintered body into electrodes for energy trapping overlapped with the plurality of strip-shaped inner electrodes in the direction of thickness.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 3:
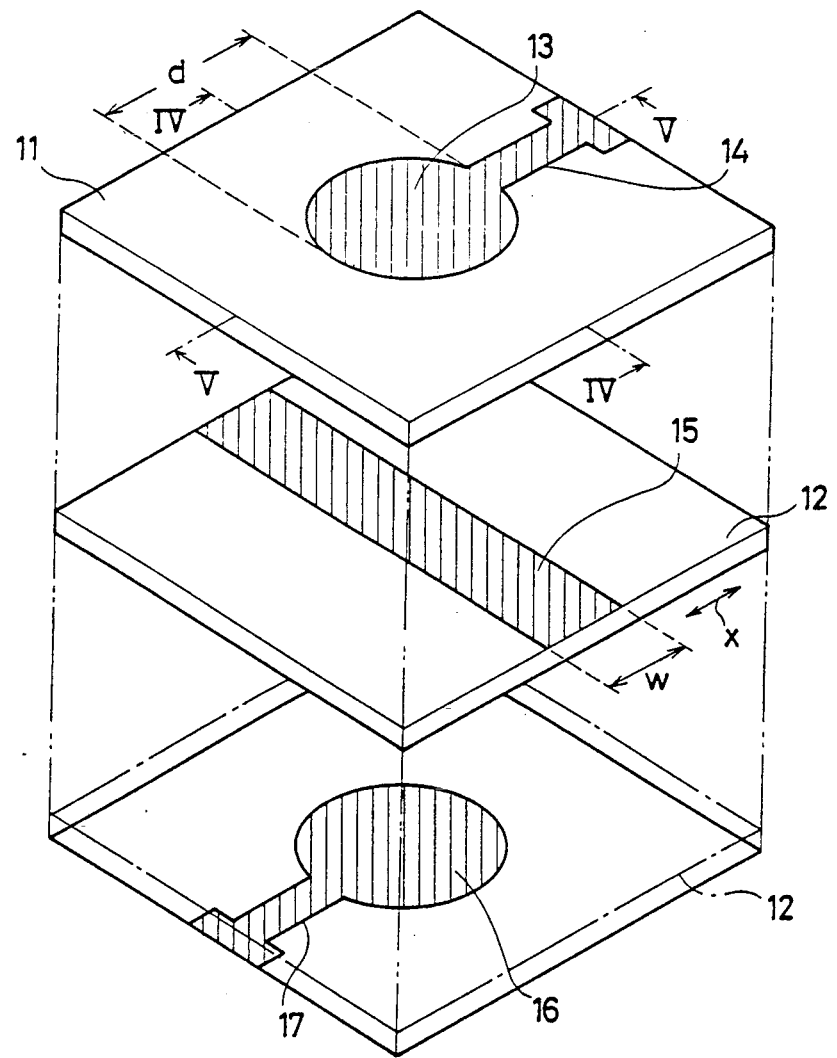
FIG. 3 is an exploded perspective view for explaining the plane shapes of ceramic green sheets used in a piezoelectric-resonance device according to a first embodiment of the present invention and electrode pastes applied on the major surfaces thereof.

Referring now to FIG. 3, description is now made of the processes for fabricating a piezoelectric-resonance device according to a first embodiment of the present invention.

First and second ceramic green sheets 11 and 12 made of a piezoelectric-material of the PZT(PbT:O$_3$-PbZrO$_3$) system are prepared. Electrode pastes 13 and 14 are applied to a portion constituting an electrode for energy trapping and a portion constituting a connecting conductive portion on the upper surface of the first ceramic green sheet 11.

A conductive paste 15 is applied in a rectangular shape to the upper surface of the second ceramic green sheet 12. This electrode paste 15 of rectangular shape is applied in a position where it is overlapped with the electrode paste 13 in the direction of thickness in overlapping the ceramic green sheets 11 and 12 with each other.

Furthermore, according to the present embodiment, the diameter d of the electrode paste 13 for energy trapping on the ceramic green sheet 11 is made longer than the width w of the electrode paste 15 of rectangular in shape. Accordingly, in overlapping the ceramic green sheets 11 and 12 with each other, the electrode pastes 13 and 15 can be easily overlapped with each other.

Additionally, electrode pastes 16 and 17 are also applied to the lower surface of the second ceramic green sheet 12 so as to form an electrode 16 for energy trapping and a connecting conductive portion 17.

Figure 4:
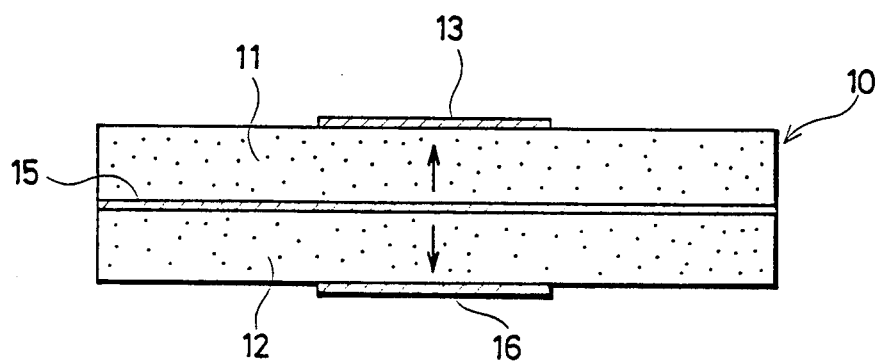
FIG. 4 is a cross-sectional view illustrating a completed piezoelectric-resonance device which corresponds to a portion taken along a line IV—IV shown in FIG. 3.
Figure 5:
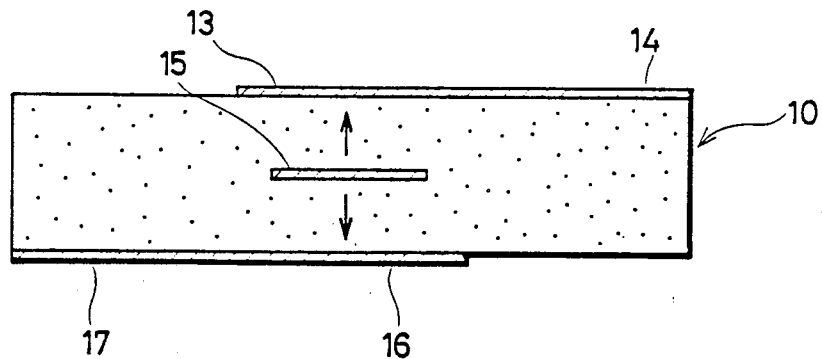
FIG. 5 is a cross-sectional view illustrating a completed piezoelectric-resonance device which corresponds to a portion taken along a line V—V shown in FIG. 3.

The ceramic green sheets 11 and 12 are overlapped with each other in a state as shown, then sintered after applying pressure in the direction of thickness, and then are subjected to predetermined polarization processing (as described below), thereby allowing a piezoelectric-resonance device shown in FIGS. 4 and 5 to be obtained.

The polarization processing is performed by applying a positive potential to the electrode 15 exposed on end faces of the sintered body 10 and applying a negative potential to the electrodes 13 and 16 on the upper and lower sides of the electrode 15. As a result, two piezoelectric ceramic layers are subjected to polarization processing in the directions represented by arrows as shown, that is, in opposite directions along the direction of thickness.

Figure 2:
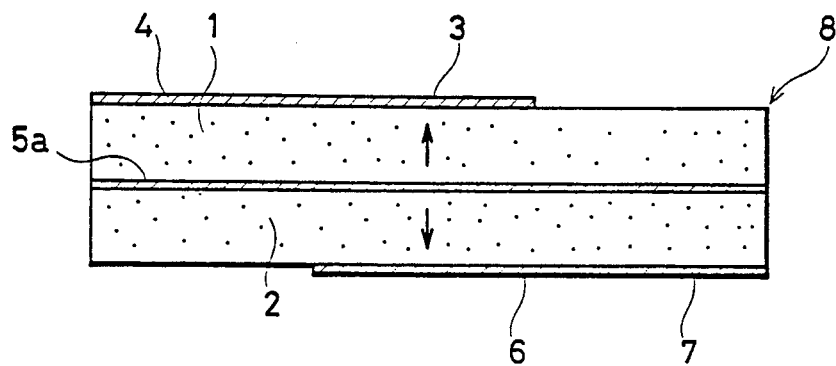
FIG. 2 is a cross-sectional view illustrating a piezoelectric-resonance device constructed using the ceramic green sheets shown in FIG. 1.

In driving operation, the piezoelectric-resonance device can be caused to resonate by periodically applying either a positive or negative potential to the electrode 13 through the connecting conductive portion 14 and applying the other potential to the electrode 16 through the connecting conductive portion 17. In the piezoelectric-resonance device according to the present embodiment, a higher harmonic in the thickness-extensional vibration mode is excited, as the piezoelectric-resonance device having the structure shown in FIG. 2. Accordingly, a piezoelectric-resonance device is feasible which can be used in a higher frequency region, as compared with a conventional single plate-type piezoelectric-resonance device.

Description is now made of the specific experimental results in a case where the width w of the electrode 15 (FIG. 3) for energy trapping arranged on the inner side is changed in the above described embodiment. First and second ceramic green sheets 11 and 12 having an area of 3×3 square millimeters and having a thickness of 0.25 millimeters are prepared. A piezoelectric-resonance device is fabricated in which the width w of the rectangular electrode 15 for energy trapping arranged on the inner side is set to 1.2 millimeters when the diameters d of the electrodes 13 and 16 for energy trapping respectively formed on the upper and lower surfaces of the ceramic green sheets 11 and 12 are set to 1.5 millimeters. In addition, for comparison, a piezoelectric-resonance device is fabricated which is the same as the piezoelectric-resonance device according to the above described embodiment except that the width w of the electrode for energy trapping arranged on the inner side is set to 1.5 millimeters.

Figure 6:
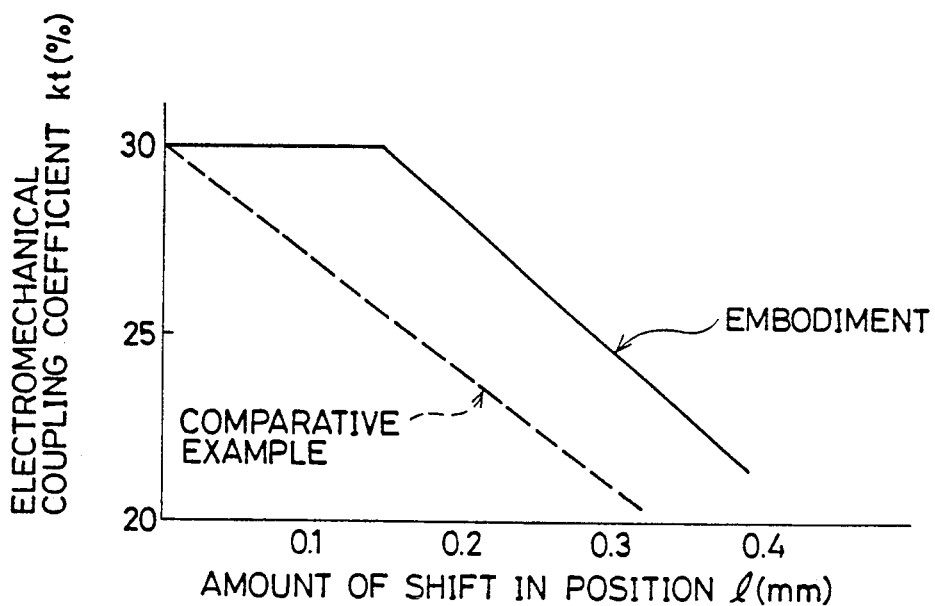
FIG. 6 is a diagram showing the relation between the electromechanical coupling coefficient and the amount of the shift in position between electrodes in the piezoelectric-resonance device in the first embodiment of the present invention and a piezoelectric-resonance device in a comparative example.

Many piezoelectric-resonance devices in the above described embodiment and in the comparative example are respectively fabricated in which the center of the electrode 13 for energy trapping on the upper surface of the ceramic green sheet 11 and the center of the electrode 15 for energy trapping on the inner side are shifted by a distance 1 in the x direction shown in FIG. 3, that is, in the direction perpendicularly intersecting such a direction that the rectangular electrode 15 for energy trapping extends. FIG. 6 shows the relation between the electromechanical coupling coefficient $k_t$ and the amount 1 of the shift in position in the piezoelectric-resonance devices of the present embodiment and in the comparative example.

As can be seen from FIG. 6, in the piezoelectric-resonance devices of the present embodiment (when the width of the electrode 15 for energy trapping is 1.2 mm), the electromechanical coupling coefficient $k_t$ is not degraded as long as the amount 1 of the shift in position does not exceed 0.15 mm. On the other hand, in the piezoelectric-resonance devices in the comparative example, the electromechanical coupling coefficient $k_t$ is degraded if the amount 1 of the shift in position exceeds zero, that is, a slight shift in position occurs between the electrodes 13 and 15.

Furthermore, the results of measurements of a spurious level in the band of frequencies between a resonance frequency and an antiresonance frequency in the piezoelectric-resonance devices in the above described embodiment and in the comparative example are shown in Table 1.

TABLE 1

| Amount of Phase Rotation | <0.5 | 0.5 << 2 | 2 << 10 | 10< |
|---|---|---|---|---|
| Embodiment w = 1.2 | 81/87 | 6/87 | 0/87 | 0/87 |
| Comparative Example w = 1.5 | 67/93 | 19/93 | 6/93 | 1/93 |

Figure 7:
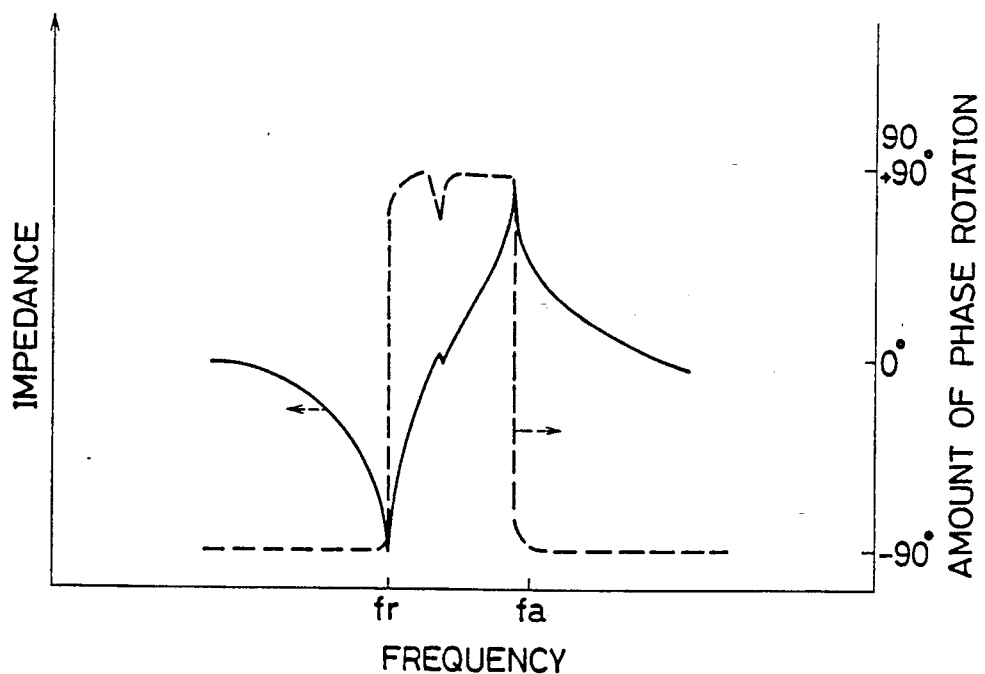
FIG. 7 is a diagram showing the relation among the impedances, the amounts of phase rotation and the frequencies of the piezoelectric-resonance device in the first embodiment of the present invention and the piezoelectric-resonance device in the comparative example.

Meanwhile, in the above described Table 1, the amount of phase rotation is employed in evaluating the spurious level. As shown in FIG. 7, when distortion based on spurious vibration occurs in an impedance waveform in the band of frequencies between a resonance frequency $f_r$ and an antiresonance frequency $f_a$, spike-shaped distortion also occurs on a phase curve (represented by a broken line). The depth of this spike-shaped distortion is referred to as the amount of phase rotation. More specifically, the amount of the phase rotation corresponds to the size of the spurious level.

As can be seen from Table 1, in the piezoelectric-resonance device according to the present embodiment, the spurious level in the band of frequencies between the resonance frequency and the antiresonance frequency can be more effectively reduced, as compared with the piezoelectric-resonance device in the comparative example.

Although in the above described embodiment, three electrodes for energy trapping are formed so as to be overlapped with each other in the direction of thickness, it should be noted that the present invention can be applied to an energy-trapping-by-frequency-lowering-type piezoelectric-resonance device in general in which four or more electrodes for energy trapping are overlapped with each other through piezoelectric layers.

Furthermore, the shapes of the electrodes for energy trapping on the outermost sides need not be necessarily made circular, and the shape of the electrode for energy trapping on the inner side need not be necessarily made polygonal. The shape of each of the electrodes for energy trapping can be arbitrarily changed in accordance with its purpose and use.

Figure 8:
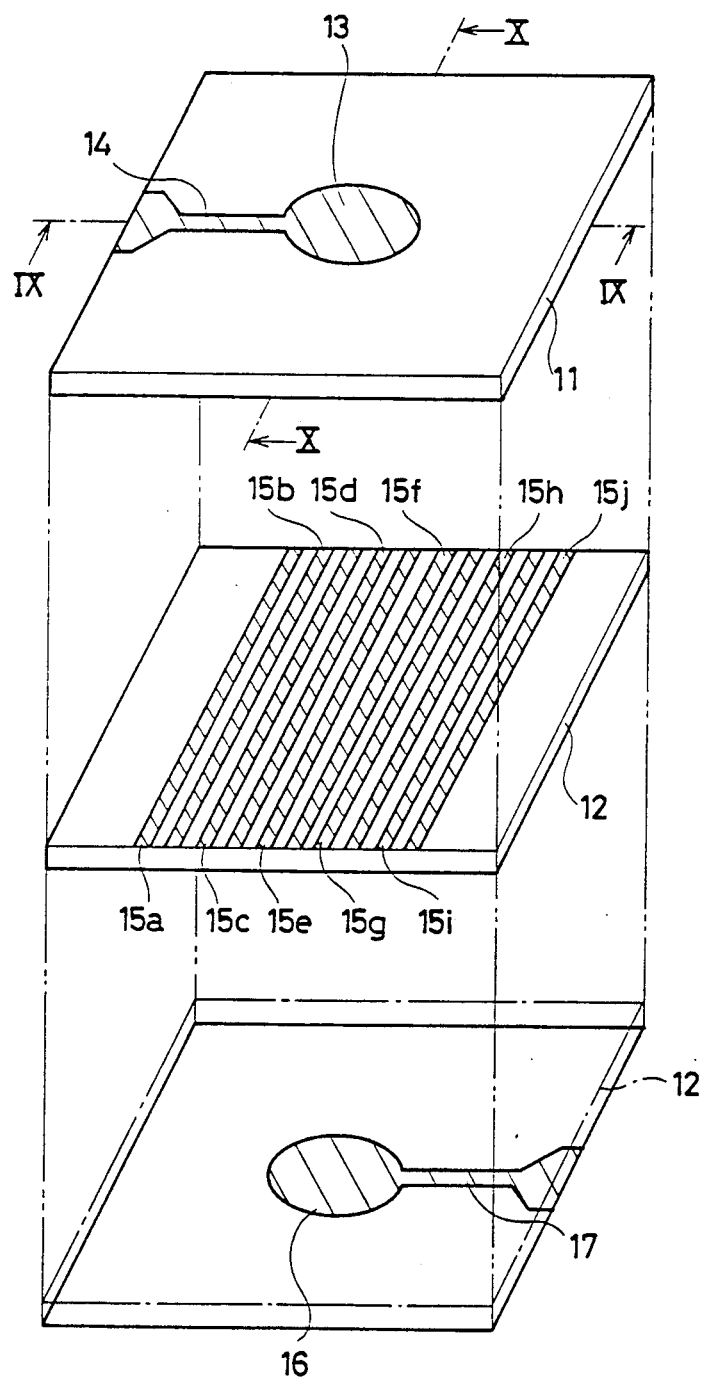
FIG. 8 is an exploded perspective view for explaining the plane shapes of the ceramic green sheets used for obtaining a piezoelectric-resonance device according to a second embodiment of the present invention, electrode pastes applied on the major surfaces of such ceramic green sheets.

Referring now to FIG. 8, description is now made of the processes for fabricating a piezoelectric-resonance device according to a second embodiment of the invention. Almost all fabricating processes are the same as those in the method of fabricating the above described piezoelectric-resonance device according to the first embodiment. Accordingly, only different portions are described in the following 1 and the description of common portions is not repeated by incorporating the description of the above described embodiment.

In obtaining a piezoelectric-resonance device according to the present embodiment, in order to form a plurality of linear electrodes 15a to 15j in a region including an electrode 13 as seen from above in overlapping ceramic green sheets 11 and 12, electrode pastes are linearly applied on the upper surface of the ceramic green sheet 12 in a lower part. More specifically, the electrode 15 for energy trapping on the inner side formed in the piezoelectric-resonance device according to the first embodiment comprises a plurality of linear electrodes 15a to 15j in the second embodiment.

Although in the present embodiment, electrodes 15a to 15j of linear shape are formed, electrodes of other shapes, for example, electrodes of a curved shape such as a snake shape may be formed, provided the electrodes are formed so as not to be electrically connected to each other.

Figure 9:
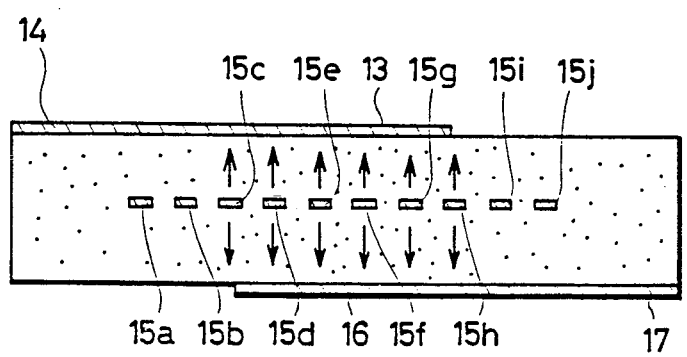
FIG. 9 is a cross-sectional view illustrating the piezoelectric-resonance device according to the second embodiment of the present invention which corresponds to a portion taken along a line IX—IX shown in FIG. 8.
Figure 10:
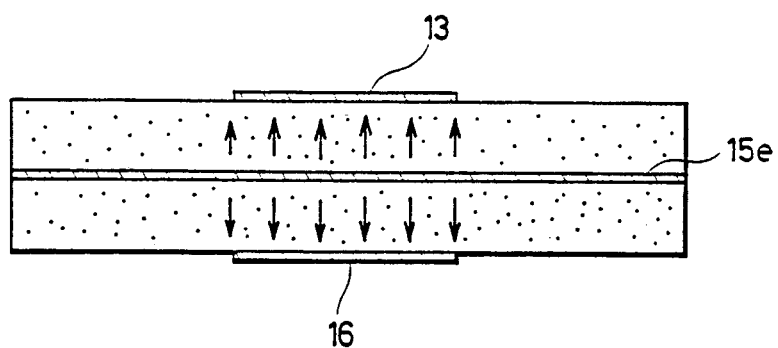
FIG. 10 is a cross-sectional view illustrating the piezoelectric-resonance device which corresponds to a portion taken along a line X—X shown in FIG. 8.

The ceramic green sheets 11 and 12 are laminated in the direction shown in FIG. 8, then sintered after applying pressure in the direction of thickness, and are subjected to poralization processing, to obtain a piezoelectric-resonance device shown in FIGS. 9 and 10.

Poralization processing is performed by applying a positive potential to the strip-shaped electrodes 15a to 15j exposed on end faces of a sintered body and applying a negative potential to electrodes 13 and 16 on the upper and lower sides. As a result, poralization processing is performed in the directions represented by arrows shown in FIGS. 9 and 10, that is, in opposite directions along the direction of thickness of two piezoelectric ceramic layers.

After poralization processing, the plurality of linear electrodes 15a to 15j are brought into a state where they are not electrically connected to each other. More specifically, when the plurality of linear electrodes 15a to 15j have been connected to each other at their end faces in polarization processing, the plurality of linear electrodes 15a to 15j are electrically disconnected by, for example, grinding the end faces.

In driving operation, the piezoelectric-resonance device can be caused to resonate by periodically applying either a positive or a negative potential to the electrode 13 through a connecting conductive portion 14 and applying the other potential to a connecting conductive portion 17 connected to the electrode 16. Even in the piezoelectric-resonance device according to the second embodiment, a secondary higher harmonic in the thickness-extensional vibration mode is greatly excited, as in the piezoelectric-resonance device according to the first embodiment. Accordingly, a piezoelectric-resonance device which can be used in a higher frequency region can be achieved.

Figure 11:
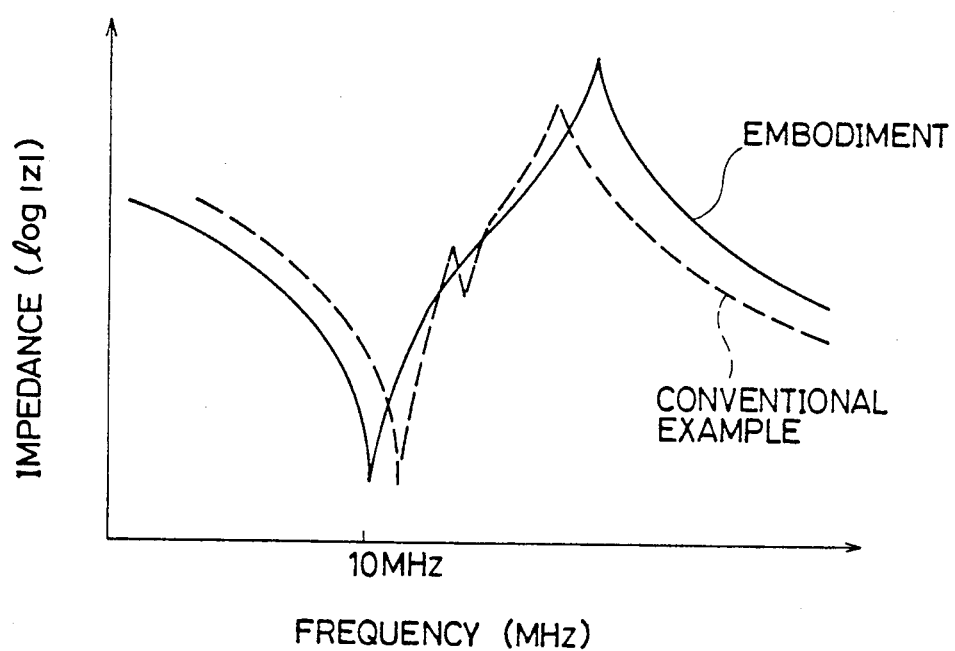
FIG. 11 is a diagram showing impedance-frequency characteristics of the piezoelectric-resonance devices in the second embodiment of the present invention and in the conventional example.

Impedance-frequency characteristics in the piexoelectric-resonance device according to the second embodiment are represented FIG. 11 by a solid line. For comparison, impedance-frequency characteristics in the piezoelectric-resonance device having the structure shown in FIG. 1 formed to be of the same size using the same material are represented by a broken line in FIG. 11.

Figure 1:
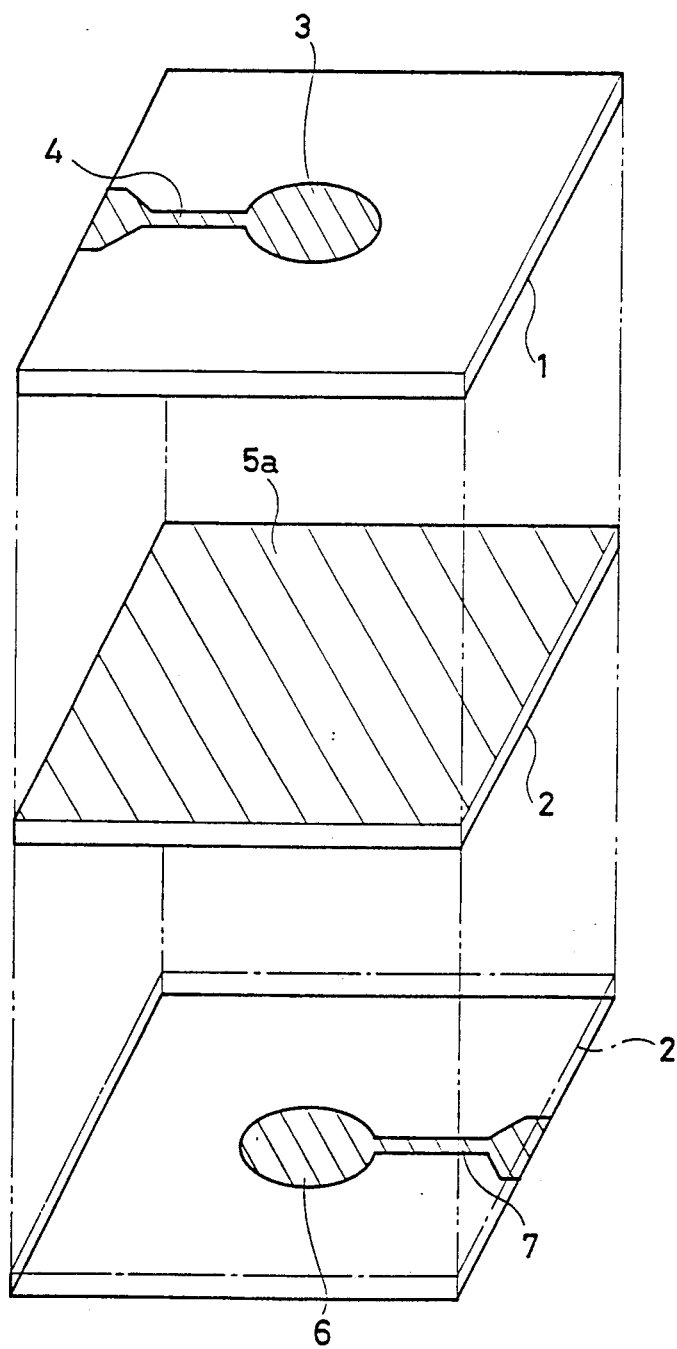
FIG. 1 is an exploded perspective view for explaining the shapes of ceramic green sheets and electrodes used to obtain a piezoelectric-resonance device related to the present invention which has not been known yet.

As obvious from FIG. 11, division of the waveform based on a spurious mode arises in the band of frequencies between antiresonance and resonance frequencies in the piezoelectric-resonance device having the structure shown in FIG. 1 in the comparative example, while such division of the waveform does not arise in the piezoelectric-resonance device according to the second embodiment. Consequently, it can be seen that occurrence of the spurious mode is effectively restrained.

Furthermore, it can be seen that the bandwidth of frequencies between resonance and antiresonance frequencies is increased in the present embodiment. This is because, in the comparative example, stray capacitance is produced between the inner electrode 5a (FIG. 1) and the connecting conductive portions 4 and 7 on its upper and lower sides, the spurious mode is excited by the stray capacitance, and the stray capacitance is added in parallel to capacitance between the electrodes overlapped with each other, so that total the capacitance between the electrodes is increased.

On the other hand, in the second embodiment (FIG. 8) the inner electrode comprises the linear electrode portions 15a to 15j, so that stray capacitance is produced between the connecting conductive portions 14 and 17 on its upper and lower sides. This stray capacitance is individually formed in the linear electrode portions 15a to 15j and is inserted in series between the electrodes. Accordingly, the contribution of capacitance between the linear electrode portions 15a to 15j on the inner side and the connecting conductive portions 14 and 17 is reduced. Consequently, it is considered that a spurious level is decreased and the bandwidth of frequencies between resonance and antiresonance frequencies is increased.

Additionally, in the second embodiment, the plurality of linear electrode portions 15a to 15j are formed in a region including the electrodes 13 and 16 overlapped with each other on the upper and lower sides. Accordingly, even if the positions where the electrodes 13 and 16 are formed are slightly shifted from the linear electrode portions 15a to 15j, a variation in characteristics is not easily caused so long as such electrodes 13 and 16 are included in the region where the linear electrode portions 15a to 15j are formed.

Figure 12:
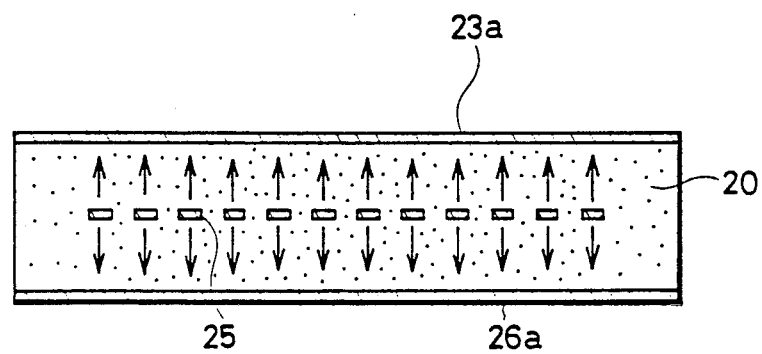
FIG. 12 is a cross-sectional view for explaining another example of polarization processing according to the second embodiment of the present invention.

Referring to FIGS. 12 and 13, description is made of a preferred modification of the piezoelectric-resonance device according to the second embodiment. As shown in FIG. 12, in this modified example, a plurality of linear electrodes 25 are formed inside a sintered body 20. This modified example is the same as the above described second embodiment except that whole surface electrodes 23a and 23a are formed on upper and lower surfaces of the sintered body 20 prior to polarization, and polarization processing is performed in such a state. More specifically, poralization processing can be performed over a wide range of the sintered body 20 as represented by arrows as shown, by applying a negative potential to the whole surface electrodes 23a and 26a and applying a positive potential to each of the linear electrodes 25.

Figure 13A:
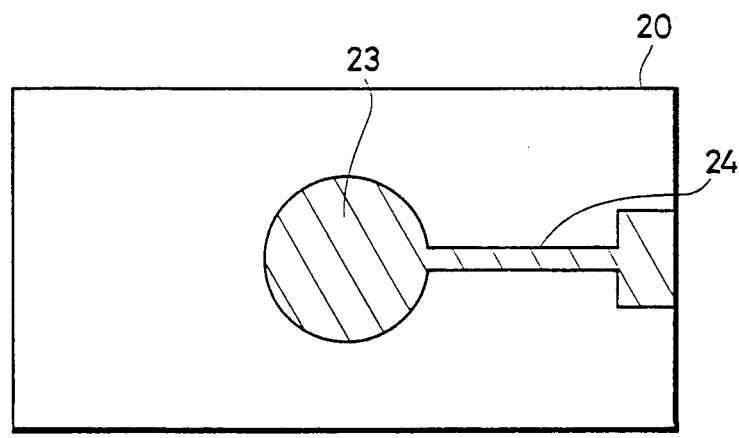
FIGS. 13A and 13B are a plan view and a cross-sectional view for respectively explaining a modified example of the piezoelectric-resonance device according to the second embodiment of the present invention.

Thereafter, the whole surface electrodes 23a and 26a are etched to form an electrode for energy trapping and a connecting conductive portion. More specifically, as shown in FIG. 13A, an electrode 23 circular in shape and a connecting electrode 24 are formed on the upper surface of the sintered body 20. Similarly, an electrode and a connecting conductive portion are formed on the lower surface thereof.

Figure 13B:
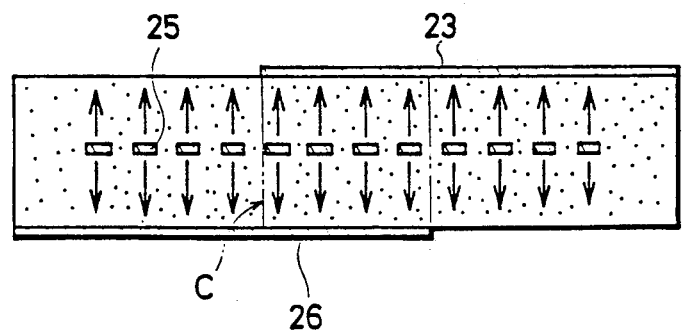

A cross section of the piezoelectric-resonance device in the modified example thus obtained is shown in FIG. 13B. As obvious from FIG. 13B, in the piezoelectric-resonance device in this modified example, energy is trapped in the sintered body between electrodes 23 and 26 formed on the upper and lower surfaces thereof, that is, in a region represented by an arrow C. Even in a region surrounding region C, however, the sintered body is subjected to poralization processing. Consequently, energy can be trapped more completely.

Meanwhile, in forming the whole surface electrodes 23a and 26a on the upper and lower surfaces of the sintered body 20 shown in FIG. 12, electrode pastes may be applied to the entire surfaces of ceramic green sheets. Alternatively, the electrode pastes may be printed and sintered on the entire surfaces of the ceramic green sheets after obtaining the sintered body 20. In addition, even in the piezoelectric-resonance device in this modified example, it goes without saying that the plurality of linear electrode portions 25 must be electrically disconnected prior to driving.

Although in the second embodiment and in the above described preferred modified example, one of three electrode which is located in the center is constituted by a plurality of linear electrode portions, such structure can be also applied to a piezoelectric-resonance device in which four or more electrodes are arranged so as to be overlapped with each other. In such a case, the same effect as those of the above described second embodiment and the modified example can be obtained simply by constituting at least one electrode by a plurality of linear electrode portions. More specifically, the allowable position where electrodes for energy trapping located on the upper and lower sides of the electrode constituted by the linear electrode portions are formed can be increased, and spurious vibration in the position can be effectively restrained.

Referring now to FIGS. 14 to 18, description is made of a method of manufacturing a piezoelectric-resonance device according to a third embodiment of the present invention.

Figure 14:
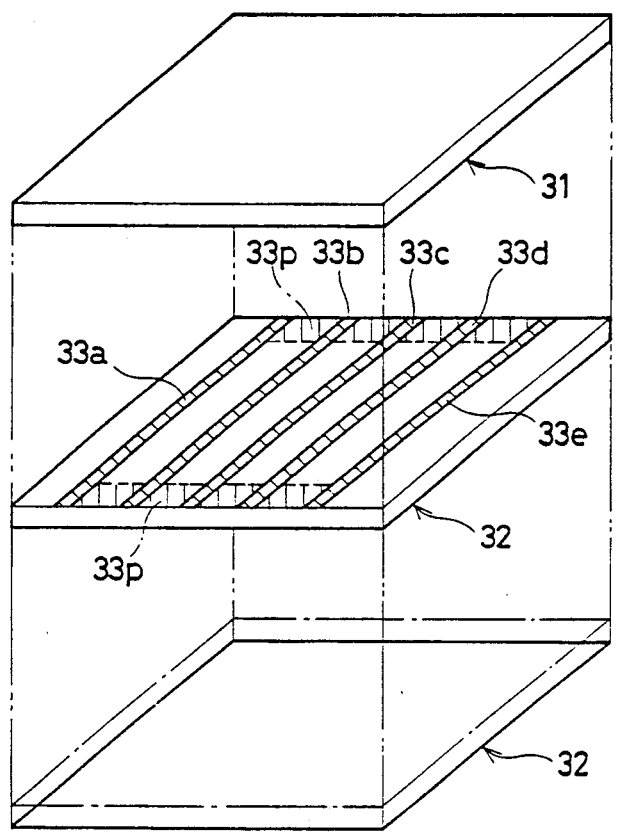
FIG. 14 is an exploded perspective view for explaining the plane shapes of ceramic green sheets used for obtaining a piezoelectric-resonance device according to a third embodiment of the present invention, and electrode pastes applied to such ceramic green sheets.

As shown in FIG. 14, first and second ceramic green sheets 31 and 32 are first formed by the Doctor blade process or the like. Electrode pastes mainly composed of Ag-Pd, Pt or the like are printed in a strip shape on the upper surface of the ceramic green sheet 32. The second ceramic green sheet 32 is laminated as shown such that strip-shaped electrode pastes 33a to 33e are located on the inner side and pressure is applied in the direction of thickness, to obtain a laminated body. This laminated body is sintered, to obtain a sintered body.

Meanwhile, in printing strip-shaped electrode paste portions 33a to 33e, connecting portions (regions represented by dot-and-dash lines 33p in FIG. 14) for connecting the electrode paste portions 33a to 33e to each other may be formed at the ends of the second ceramic green sheet 32.

Figure 15:
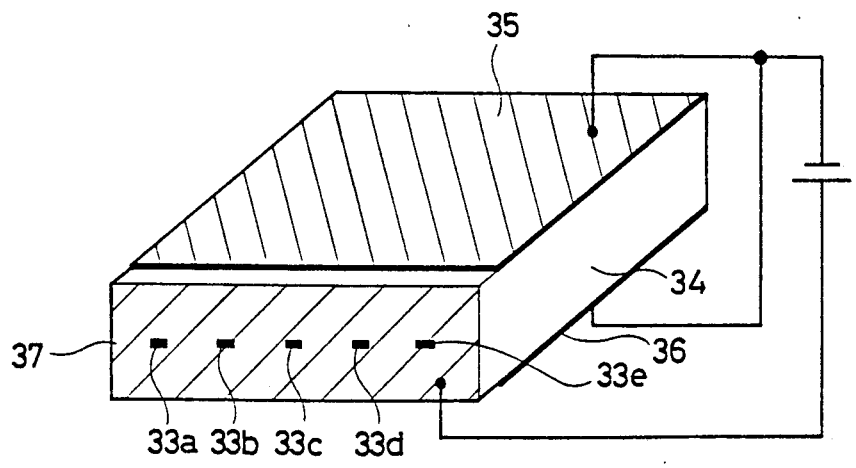
FIG. 15 is a perspective view for explaining typical polarization processing.

As shown in FIG. 15, electrodes 35 and 36 are then formed over the almost entire upper and lower surfaces of a sintered body 34. The electrodes 35 and 36 may be formed by any of methods such as sintering of conductive pastes, sputtering and vacuum evaporation. Similarly, an electrode 37 for polarization is printed and sintered on an end face portion where strip-shaped inner electrodes 33a to 33e (the same reference numerals as the above noted electrode paste portions are assigned) are exposed.

In FIG. 15, the electrodes 35 and 36 on the upper and lower surfaces of the sintered body 34 are not formed on the entire upper and lower surfaces thereof so as to avoid conduction between the electrodes 35 and 36 and the electrode 37 for polarization. However, the electrodes 35 and 36 may be formed on the entire upper and lower surfaces provided that conduction between the electrodes 35 and 36 and the electrode 37 for poralization can be avoided.

Figure 16:
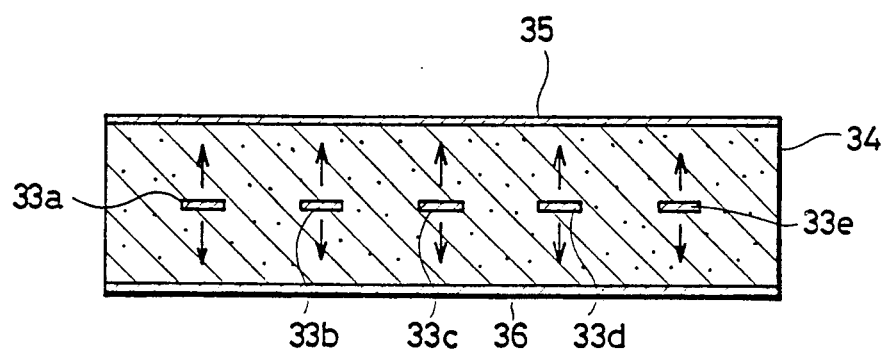
FIG. 16 is a cross-sectional view illustrating a sintered body subjected to polarization processing in the third embodiment of the present embodiment.

Then, as shown in FIG. 15, the sintered body 34 is subjected to poralization processing by applying a voltage between the electrodes 35 and 36 on the upper and lower surfaces thereof and the electrode 37 for poralization. A state where the sintered body 34 was subjected to poralization processing is shown in FIG. 16. As obvious from FIG. 16, the sintered body 34 is polarized in different directions along the direction of thickness on both sides of the strip-shaped inner electrodes 33a to 33e.

The electrodes 35 and 36 on the upper and lower surfaces of the sintered body 34 are then etched. As shown in a plan view of FIG. 17, such etching is done so as to form a plurality of electrodes 38a for energy trapping and connecting conductive portions 38b on the upper surface. Electrodes for energy trapping and connecting conductive portions 39b of the same shapes are formed on the lower surface, as represented by broken lines. Accordingly, there is realized a construction in which a plurality of pairs of electrodes for energy trapping are arranged so as to be overlapped with the strip-shaped inner electrodes 33a to 33e through piezoelectric ceramic layers.

Positioning in the above described etching is allowed on the basis of the inner electrodes 33a to 33e exposed on the end faces of the sintered body 34. Therefore, the electrodes 38a for energy trapping can be easily and precisely overlapped with the strip-shaped inner electrodes.

Figure 17:
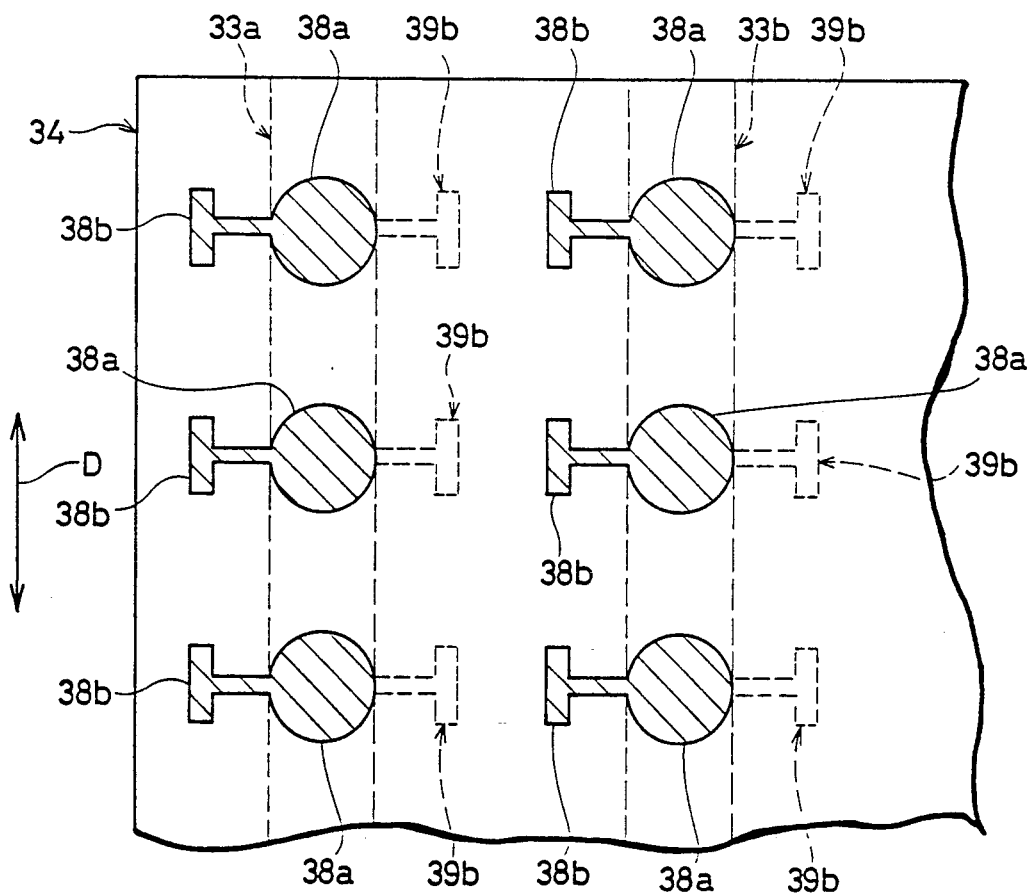
FIG. 17 is a partially cutaway plan view for explaining the shapes of electrodes for energy trapping formed by etching.
Figure 18:
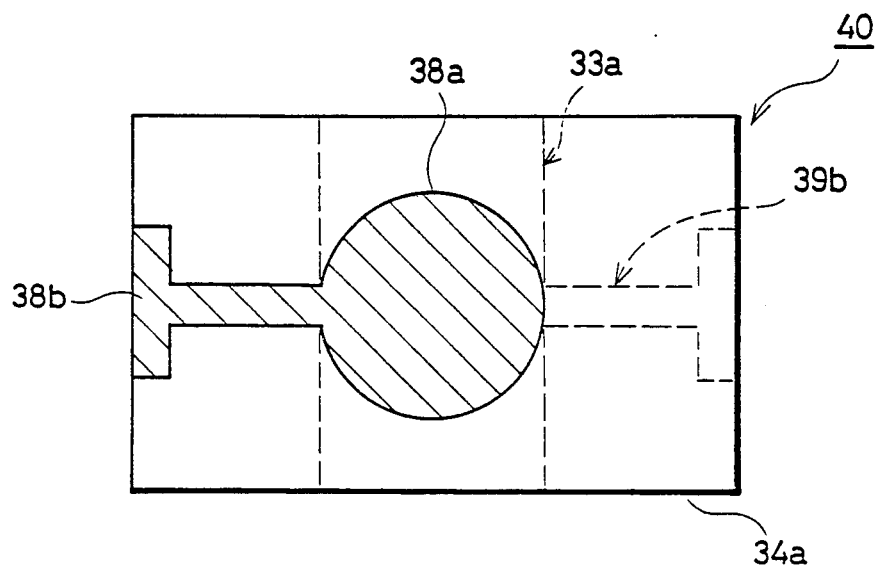
FIG. 18 is a plan view illustrating the piezoelectric-resonance device obtained according to the third embodiment of the present invention.

Thereafter, a sintered body 34 shown in FIG. 17 is cut so as to obtain a single piezoelectric-resonance device for each pair of electrodes 38a for energy trapping on upper and lower surfaces thereof. Consequently, a piezoelectric-resonance device 40 as shown in a plan view of FIG. 18 can be obtained. In this piezoelectric-resonance device 40, there are formed electrodes 38a for energy trapping on upper and lower surfaces of a sintered body 34a (an electrode for energy trapping on the lower surface is not shown) so as to be overlapped with a strip-shaped inner electrode 33a in the direction of thickness, and connecting conductive portions 38b and 39b electrically connected to each of the electrodes 38a for energy trapping and brought out to opposed edges, of the sintered body 34a.

In the method of fabricating the piezoelectric-resonance device according to the present embodiment, the electrodes 38a for energy trapping on the upper and lower surfaces are formed by etching so as to be overlapped with the strip-shaped inner electrodes 33a to 33e in the direction of thickness through the piezoelectric ceramic layers. Accordingly, in the above described etching, precision of overlapping of the electrodes 38a with the strip-shaped inner electrodes 33a to 33e is not decreased even if the positions where the electrodes 38 are formed are slightly shifted in the direction D in FIG. 17, that is, in the direction that the inner electrodes extend. Accordingly, it is found that precision of overlapping of the inner electrodes with the electrodes for energy trapping formed on its outer surface can be rapidly increased in obtaining a laminatedtype piezoelectric-resonance device.

Although in the above described embodiment, the electrode paste portions 33a to 33e having a uniform width are formed on the ceramic green sheet 32 in forming the strip-shaped inner electrodes, the shape of each of the inner electrodes is not limited to the above described "strip shape" provided that the inner electrode has its length larger than its width. For example, as respectively shown in FIGS. 19A, 19B and 19C, the inner electrodes may take such shapes that wide portions 41, 42 and 43 are arranged along the direction of length of strip-shaped electrode paste portions partially corresponding to the shapes of the electrodes for energy trapping on upper and lower surfaces, that is, in positions where the electrodes for energy trapping on upper and lower surfaces are overlapped with each other.

Figures 19A, 19B, 19C:
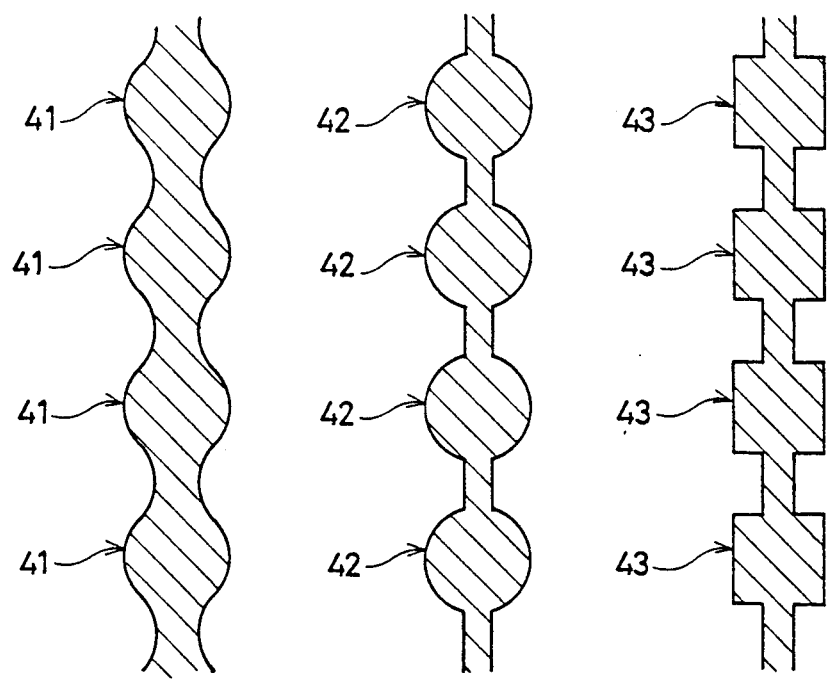
FIGS. 19A, 19B and 19C are partially cutaway plan views for respectively explaining other examples of the shapes of strip-shaped electrode paste portions.

Also in a case where the strip-shaped electrode paste portions of the shapes shown in FIGS. 19A, 19B and 19C are constructed, the same effect as that in the above described embodiment can be obtained provided that the lengths of the wide portions 41 to 43 are larger than those of the electrodes for energy trapping formed on the upper and lower surfaces. More specifically, positioning in the longitudinal direction of the strip-shaped electrodes is facilitated by keeping the wide portions 41 to 43 long, and precision of overlapping of the strip-shaped electrodes with the electrodes for energy trapping on upper and lower surfaces can be increased.

Additionally, although in the above described embodiment, a plurality of strip-shaped electrode paste portions are formed on a large ceramic green sheet so as to obtain many piezoelectric-resonance devices, the present invention can be also applied to a case where a single piezoelectric-resonance device is fabricated using a ceramic green sheet, corresponding to the size of the piezoelectric-resonance device, on which one strip-shaped electrode paste portion is printed.

Furthermore, two or more first ceramic green sheets and second ceramic green sheets may be respectively laminated. Consequently, the present invention can be also applied to the fabrication of a piezoelectric-resonance device in which a plurality of strip-shaped outer electrodes are laminated and the number of the electrodes is four or more.

Although the present invention has been described and illustrated in detail, it is clearly understood that the same is by way of illustration and example only and is not to be taken by way of limitation; the spirit and scope of the present invention being limited only by the terms of the appended claims.

What is claimed is:

1. An energy-trapping-by-frequency-lowering-type-piezoelectric-resonance device utilizing a higher harmonic in the mode of thickness-extensional vibration, comprising:

a plate-shaped body made of piezoelectric material subjected to polarization processing; and
    at least three electrodes for energy trapping arranged so as to be overlapped with each other in the direction of thickness of said body through layers of the piezoelectric material, and comprising a pair of outermost electrodes and at least one inner electrode;
    the dimension of diameter or of one polygonal side of at least one of said outermost electrodes being made larger than the dimension of diameter or of one polygonal side of said inner electrode.

2. The piezoelectric-resonance device according to claim 1, wherein:

said at least one inner electrode has a rectangular shape; and
    a short side of the rectangular shape is made shorter than the diameter or one side of each of said outermost electrodes.

3. The piezoelectric-resonance device according to claim 2, wherein:

connecting conductive portions extending to edges of the plate-shaped body are connected to said outermost electrodes; and
    said rectangular, inner electrode is formed so as to extend in a region where it is not overlapped with said connecting conductive portions.

4. The piezoelectric-resonance device according to claim 3, wherein said rectangular, inner electrode has a long side exposed on opposed end faces of the plate-shaped body.

5. The piezoelectric-resonance device according to claim 1, wherein:

said inner electrode comprises a plurality of electrodes which are electrically separated from each other; and
    a short side of each of said electrodes is made shorter than the diameter or one polygonal side of each of the outermost electrodes.

6. The piezoelectric-resonance device according to claim 5, wherein said plurality of electrodes are formed in a distributed manner in a region including said outermost electrodes as viewed from said direction of thickness.

7. A energy-trapping-by-frequency-lowering-type piezoelectric-resonance device utilizing a higher harmonic in the mode of thickness-extensional vibration, comprising:

a plate-shaped body made of piezoelectric material subjected to polarization processing; and
    at least three electrodes arranged so as to be overlapped with each other in the direction of thickness of said body through layers of the piezoelectric-material, and comprising a pair of outermost electrodes and at least one inner electrode;
    said at least one electrode being formed in an area including the area occupied by one of said outermost electrodes, and being constituted by a plurality of electrodes which are electrically separated from each other.

8. The energy-trapping-by-frequency-lowering-type piezoelectric resonator according to claim 7, wherein the electrode constituted of a plurality of electrically separated electrodes comprises said at least one inner electrode.

* * * * *